US006930510B2

(12) United States Patent
New

(10) Patent No.: US 6,930,510 B2
(45) Date of Patent: Aug. 16, 2005

(54) FPGA ARCHITECTURE WITH MIXED INTERCONNECT RESOURCES OPTIMIZED FOR FAST AND LOW-POWER ROUTING AND METHODS OF UTILIZING THE SAME

(75) Inventor: Bernard J. New, Carmel Valley, CA (US)

(73) Assignee: Xilinx, Inc., San Jose, CA (US)

( * ) Notice: Subject to any disclaimer, the term of this patent is extended or adjusted under 35 U.S.C. 154(b) by 111 days.

(21) Appl. No.: 10/378,735

(22) Filed: Mar. 3, 2003

(65) Prior Publication Data

US 2004/0174187 A1 Sep. 9, 2004

(51) Int. Cl.⁷ .......................................... H03K 19/177
(52) U.S. Cl. .............................. 326/41; 326/38; 326/39
(58) Field of Search ........................... 326/37, 38, 39, 326/41

(56) References Cited

U.S. PATENT DOCUMENTS

| | | | |
|---|---|---|---|
| 5,504,440 A | | 4/1996 | Sasaki |
| 5,808,479 A | * | 9/1998 | Sasaki et al. ................. 326/41 |
| 5,880,598 A | * | 3/1999 | Duong ......................... 326/41 |
| 5,892,961 A | * | 4/1999 | Trimberger ................... 712/10 |
| 5,914,616 A | | 6/1999 | Young et al. |
| 6,163,168 A | * | 12/2000 | Nguyen et al. ............... 326/41 |
| 6,348,813 B1 | * | 2/2002 | Agrawal et al. .............. 326/41 |
| 6,362,649 B1 | * | 3/2002 | McGowan .................... 326/41 |
| 6,448,808 B2 | * | 9/2002 | Young et al. ................. 326/41 |
| 6,583,645 B1 | * | 6/2003 | Bennett et al. ............... 326/41 |
| 6,621,325 B2 | | 9/2003 | Hart et al. |

FOREIGN PATENT DOCUMENTS

| | | |
|---|---|---|
| WO | WO 00/52826 A | 9/2000 |
| WO | WO 01/28097 A | 4/2001 |

OTHER PUBLICATIONS

Xilinx, Inc.; "Virtex–II Platform FPGA Handbook"; published Dec. 2000; available from Xilinx, Inc., 2100 Logic Drive, San Jose, California 95124; pp. 33–75.

Michael Hutton, et al.; "Interconnect Enhancements for a High–Speed PLD Architecture"; Feb. 24–26, 2002; available from Altera Corporation, 101 Innovation Drive, San Jose, California 95134; 8 pages.

U.S. patent application Ser. No. 09/956,203, Hart et al., filed Sep. 18, 2001.

Vaughn Betz et al.; "FPGA Routing Architecture Segmentation and Buffering to Optimize Speed and Density", ACM/SIGDA International Symposium on Field Programmable Gate Arrays; FPGA 99; Feb. 231–23, 1999; pp. 59–68.

(Continued)

Primary Examiner—Michael Tokar
Assistant Examiner—Linh V. Nguyen
(74) Attorney, Agent, or Firm—Lois D. Cartier

(57) ABSTRACT

An FPGA includes a programmable interconnect structure in which the interconnect resources are divided into two groups. A first subset of the interconnect resources are optimized for high speed. A second subset of the interconnect resources are optimized for low power consumption. In some embodiments, the transistors of the first and second subsets have different threshold voltages. Transistors in the first subset, being optimized for speed, have a lower threshold voltage than transistors in the second subset, which are optimized for low power consumption. The difference in threshold voltages can be accomplished by using different doping levels, wells biased to different voltage levels, or using other well-known means. In some embodiments, the first subset of the interconnect resources includes buffers coupled to a higher voltage level than the second subset. In some embodiments, the first subset includes buffers manufactured using larger transistors than those in the second subset.

6 Claims, 6 Drawing Sheets

OTHER PUBLICATIONS

Ping–Tsung Wang, et al.; "A Hierarchical Interconnection Structure for Field–Programmable Gate Arrays"; Institute of Electrical and Electronics Engineers; Proceedings of the Region Ten Conference; Oct. 19–21, 1993; vol. 3; pp. 557–560.

Ivo Dobbelaere et al.; "Regenerative Feedback Repeaters for Programmable Interconnections"; IEEE Journal of Solid–State Circuits, IEEE Inc.; vol. 30 No. 11; Nov. 1, 1995; pp. 1246–1253.

* cited by examiner

FPGA ARCHITECTURE WITH MIXED INTERCONNECT RESOURCES OPTIMIZED FOR FAST AND LOW-POWER ROUTING AND METHODS OF UTILIZING THE SAME

FIELD OF THE INVENTION

The invention relates to Field Programmable Gate Arrays (FPGAs). More particularly, the invention relates to an FPGA architecture that includes both interconnect resources optimized for speed and interconnect resources optimized for low power consumption.

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBS) and programmable input/output blocks (IOBs). The CLBs and IOBs are interconnected by a programmable interconnect structure. Some FPGAs also include additional logic blocks with special purposes (e.g., DLLs, RAM, and so forth).

The interconnect structure, CLBs, IOBs, and other logic blocks are typically programmed by loading a stream of configuration data (bitstream) into internal configuration memory cells that define how the logic blocks and interconnect are configured. The configuration data can be read from memory (e.g., an external PROM) or written into the FPGA by an external device. The collective states of the individual memory cells then determine the function of the FPGA.

One such FPGA, the Xilinx Virtex®-II FPGA, is described in detail in pages 33–75 of the "Virtex-II Platform FPGA Handbook", published December, 2000, available from Xilinx, Inc., 2100 Logic Drive, San Jose, Calif. 95124, which pages are incorporated herein by reference.

FIG. 1 shows a typical FPGA architecture. The FPGA of FIG. 1 includes an array of logic blocks (e.g., CLBs 101a–101i) interconnected by a programmable interconnect structure. The interconnect structure includes interconnect lines (103a–103i, 104a–104i) coupled together by programmable switches (102a–102i).

One goal shared by many system designers is to obtain the highest operating frequency consistent with various design considerations including cost, power consumption, size, and so forth. Therefore, there is considerable motivation to provide fast programmable interconnect resources, as in the FPGA of FIG. 1. There are several known ways to improve the speed of programmable interconnect resources. One common method is to include interconnect lines of various lengths, e.g., spanning one CLB, two CLBs, six CLBs, half of the CLB array, and so forth. Another approach is to make some of the interconnect resources non-programmable, so the signals implemented using these resources do not traverse the programmable switches. Another method is to optimize the interconnect resources for speed by making the interconnect lines wider to reduce resistance, providing more space between interconnect lines to decrease coupling capacitance, and so forth.

However, each of these methods has a price in terms of increased silicon area, decreased routing flexibility, and so forth. Therefore, an approach has been suggested in which some interconnect resources are modified for higher speed while other interconnect resources are unmodified. For example, some interconnect lines can be wider and spaced further apart, while other interconnect lines use the minimum width and spacing supported by the manufacturing process.

FIG. 2 illustrates an FPGA designed using interconnect resources of two different speeds. The FPGA of FIG. 2 is similar to that of FIG. 1, except that the interconnect lines include both faster and slower interconnect lines.

Power consumption is often another concern of system designers. Power consumption can be a larger issue in programmable devices than in non-programmable devices. For example, in an FPGA each programmable switch has associated capacitance, which results in increased power dissipation. Further, FPGAs are consistently growing in size and supporting larger numbers of logic blocks. As the number of logic blocks in an FPGA increases, the numbers of interconnect resources required to service each logic block increases at a faster rate. Therefore, today's larger FPGAs have a higher percentage of silicon area devoted to interconnect resources than earlier, smaller FPGAs. Thus, the majority of the power dissipated in a modern FPGA is consumed by the programmable interconnect structure.

Therefore, it is desirable to provide an FPGA including a programmable interconnect structure in which fast interconnect resources are provided for critical signals, but which does not unnecessarily consume power.

SUMMARY OF THE INVENTION

The invention provides an FPGA having a programmable interconnect structure in which the interconnect resources are divided into two groups. A first subset of the interconnect resources are optimized for high speed. A second subset of the interconnect resources are optimized for low power consumption. In some embodiments, the transistors of the first and second subsets have different threshold voltages. Transistors in the first subset, being optimized for speed, have a lower threshold voltage than transistors in the second subset, which are optimized for low power consumption. The difference in threshold voltages can be accomplished using well-known methods such as different doping levels or wells biased to different voltage levels, or by other means. In other embodiments, the interconnect resources include buffers optimized by varying voltage levels, transistor sizes, and so forth.

According to one aspect of the invention, an FPGA includes a plurality of configurable logic blocks (CLBs) and a plurality of interconnect resources programmably interconnecting the CLBs. The interconnect resources comprise first and second sets of interconnect resources. The interconnect resources in the first set are optimized for high speed, and the interconnect resources in the second set are optimized for low power consumption.

In some embodiments, the interconnect resources in the first set include a set of first transistors, while the interconnect resources in the second set include a set of second transistors. The first transistors have a lower effective threshold voltage than the second transistors. The lower effective threshold voltage results in a faster switching speed for the first set of interconnect resources. However, leakage current is increased, increasing the power consumption of the first set of interconnect resources. In some embodiments, the first and second transistors have different doping levels. In some embodiments, the first and second transistors are situated in wells biased to different voltage levels.

In some embodiments, the interconnect resources in the first set (optimized for speed) include a set of first buffers coupled to a first power source. The interconnect resources in the second set (optimized for low power consumption) include a set of second buffers coupled to a second power source. The first power source supplies a higher voltage level than the second power source, giving the first set of resources both faster operation and higher power consumption.

In some embodiments, the first subset includes buffers manufactured using larger transistors than those in the second subset. In other embodiments, the first subset includes buffered interconnect lines, while the second subset includes unbuffered interconnect lines.

According to another aspect of the invention, a method of implementing a user circuit in an FPGA includes the steps of determining a set of critical paths in the user circuit, determining a set of non-critical paths in the user circuit, determining a first set of interconnect resources in the FPGA that are optimized for high speed, determining a second set of interconnect resources in the FPGA that are optimized for low power, and assigning each path in the set of critical paths to one of the interconnect resources in the first set.

In some embodiments, each path in the set of non-critical paths is assigned to one of the interconnect resources in the second set. In other embodiments, each path is assigned to remaining interconnect resources available from either set.

In some embodiments, determining a first set of interconnect resources in the FPGA that are optimized for high speed comprises consulting a computer data file identifying the first set of interconnect resources for the FPGA.

According to another aspect of the invention, a method of implementing a user circuit in an FPGA includes the steps of determining a first set of interconnect resources in the FPGA that are optimized for high speed, determining a second set of interconnect resources in the FPGA that are optimized for low power, assigning a first and higher cost to the interconnect resources in the first set, assigning a second and lower cost to the interconnect resources in the second set, and routing the design using timing-driven routing software designed to meet specified timing requirements while minimizing a cost function utilizing the costs assigned to the interconnect resources in the first and second sets. The cost function is based at least in part on the amount of power consumed by the circuit.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 1:
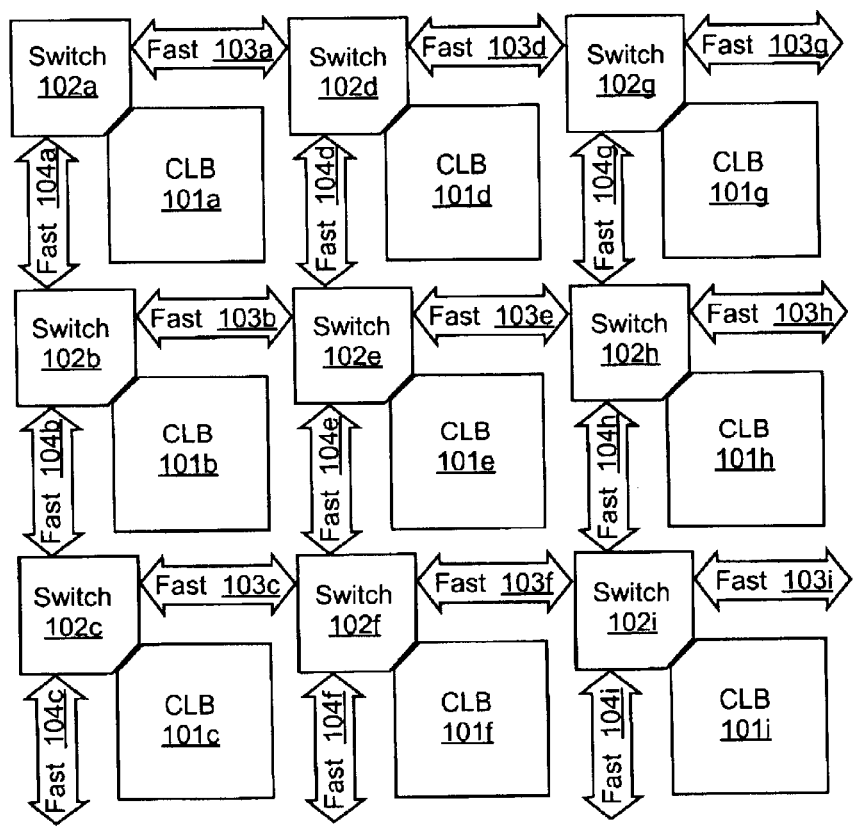
FIG. 1 is an architectural representation of a prior art FPGA including only fast interconnect resources.
Figure 2:
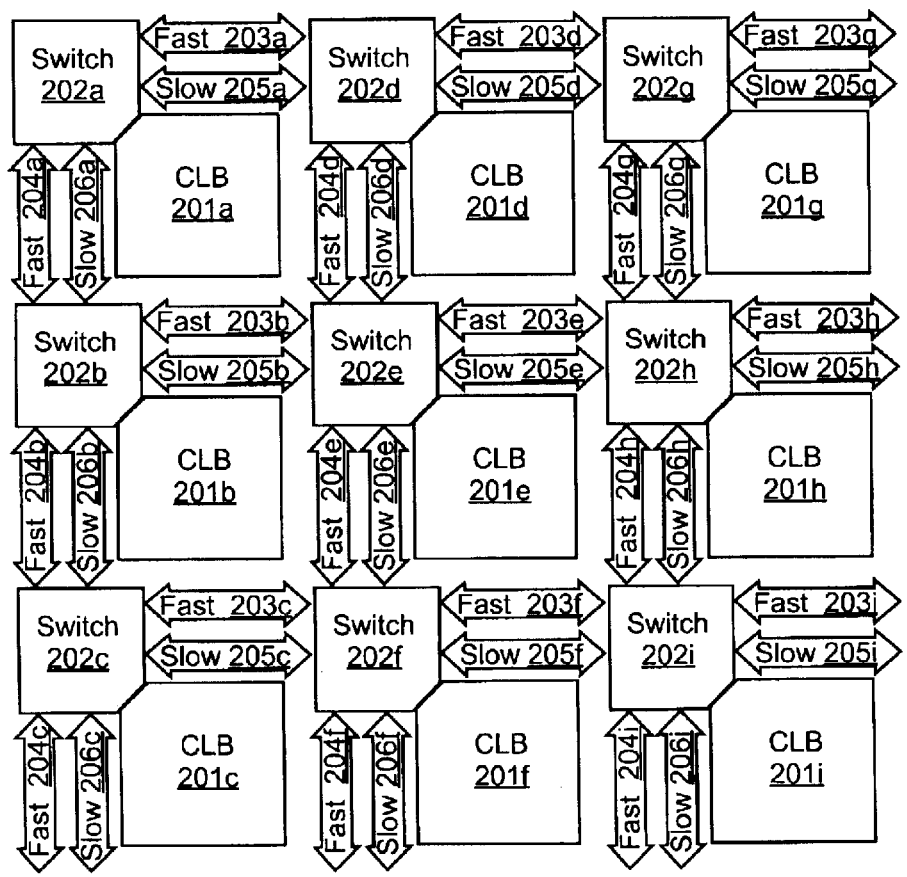
FIG. 2 is an architectural representation of a prior art FPGA including both fast and slow interconnect resources.
Figure 3:
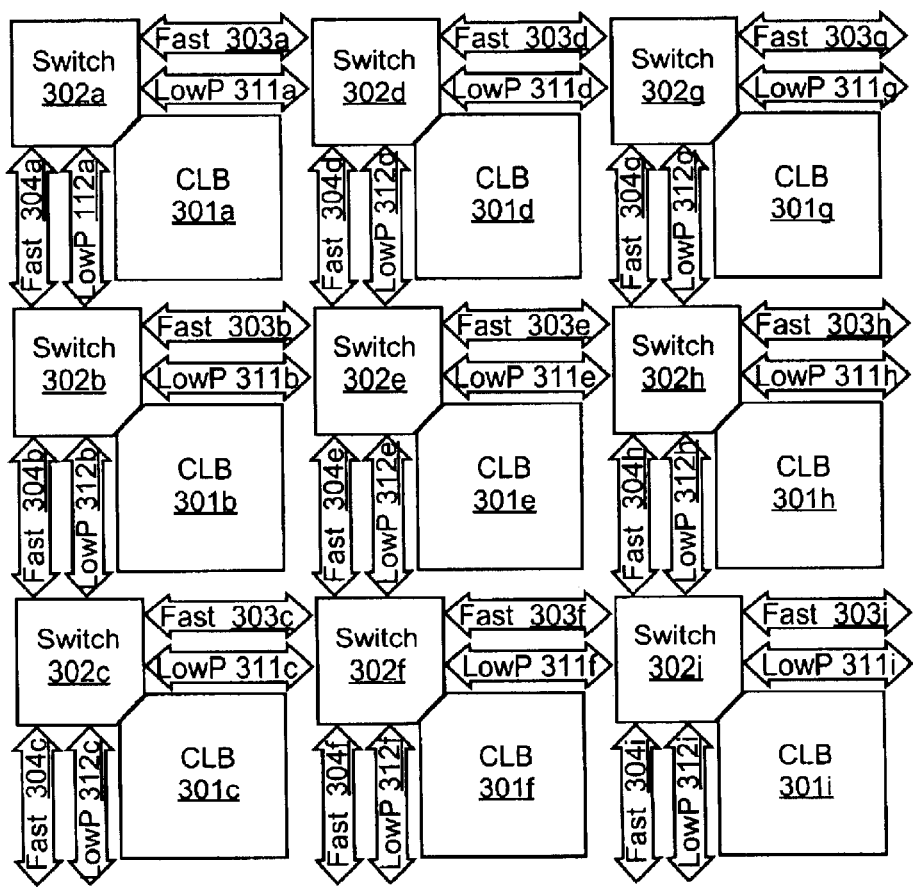
FIG. 3 is an architectural representation of an FPGA including interconnect resources separately optimized for high speed and low power, according to an embodiment of the invention.

FIG. 3 shows an FPGA architecture that provides two different types of interconnect resources; a first set of resources optimized for speed and a second set of resources optimized for low power consumption. The FPGA of FIG. 3 includes an array of logic blocks (CLBs 301a–301i) interconnected by a programmable interconnect structure. The interconnect structure includes interconnect lines (303a–303i, 304a–304i, 311a–311i, 312a–312i) coupled together by programmable switches (302a–302i).

A first set of the interconnect resources in FIG. 3 includes interconnect lines 303a–303i and 304a–304i. Additionally, the first set of interconnect resources can include a portion of programmable switches 302a–302i. The first set of resources is optimized for high speed. For example, these resources can be the same as those currently available in most FPGAs, where the interconnect resources are typically optimized for high speed. For example, long interconnect lines can be supplied for traversing multiple CLBs, and these long interconnect lines can be buffered.

A second set of the interconnect resources in FIG. 3 includes interconnect lines 311a–311i and 312a–312i. Additionally, the second set of interconnect resources can include a portion of programmable switches 302a–302i. The second set of resources is optimized for low power consumption. In some embodiments, the power consumption of the second set of resources is reduced by raising the effective threshold voltage of some or all of the transistors in the second set. Raising the effective threshold voltage of a transistor'slows down the switching of the transistor, but reduces leakage current, thereby reducing the power consumption by the transistor.

As is well known in the relevant arts, the effective threshold voltage of a transistor can be raised using any of several techniques. For example, the threshold voltage of the transistor can be actually reduced by changing the doping levels in the transistor structure during manufacture of the FPGA. Clearly, reducing the actual threshold voltage of the transistor also reduces the effective threshold voltage. However, the threshold voltage of the transistor can also be effectively reduced by placing the transistor within a well, which is then biased to a voltage level different from the voltage level of the substrate used by other transistors (e.g., transistors within the first set of interconnect resources).

Figure 4:
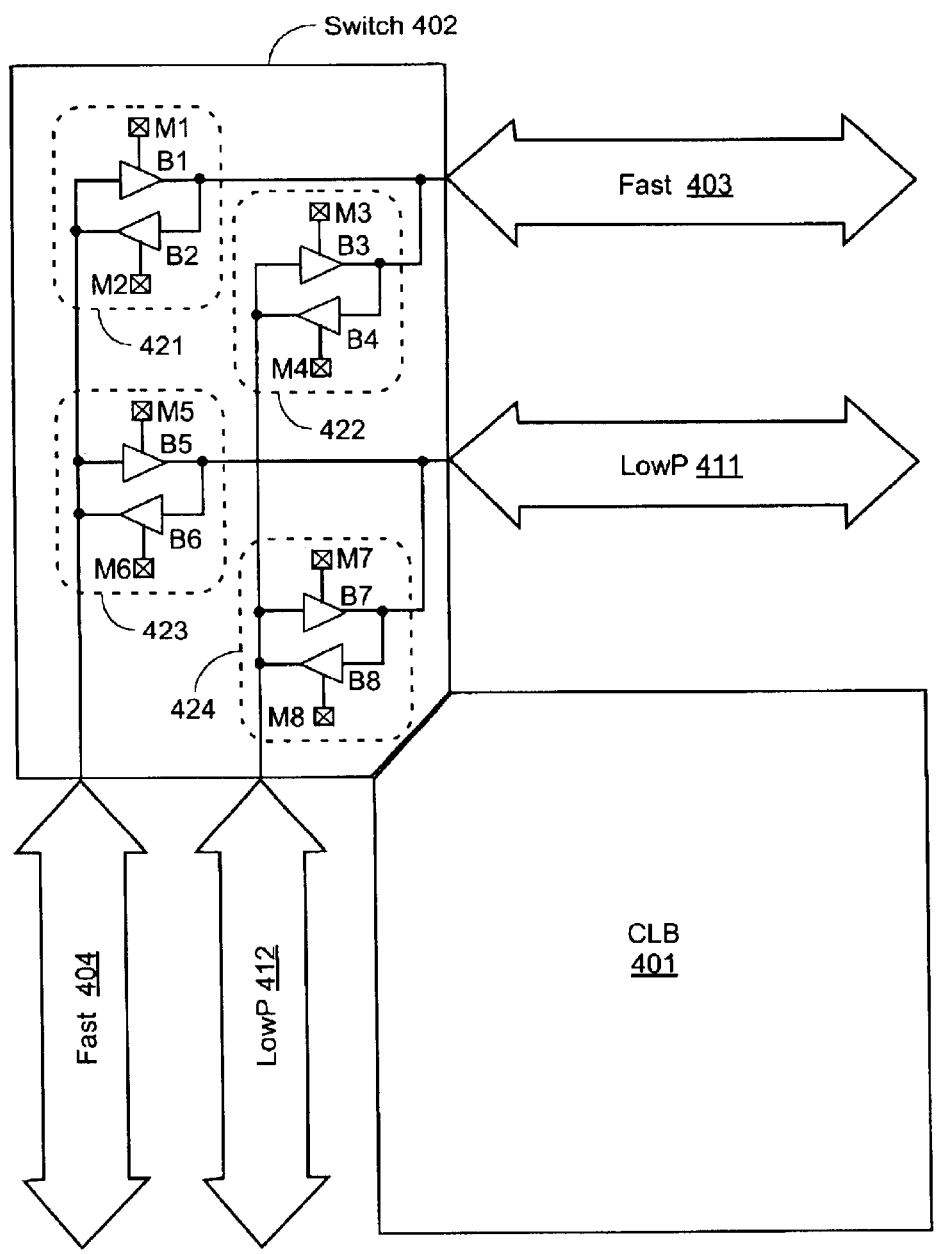
FIG. 4 is a block diagram of an FPGA tile from the FPGA of FIG. 3, according to an embodiment of the invention.

FIG. 4 illustrates in more detail one tile from the FPGA of FIG. 3. In the FPGA tile of FIG. 4, programmable switch 402 includes four areas 421–424. In the pictured embodiment, area 421 includes programmable tristate buffers B1, B2 controlled by configuration memory cells M1, M2. Area 422 includes programmable tristate buffers B3, B4 controlled by configuration memory cells M3, M4. Area 423 includes programmable tristate buffers B5, B6 controlled by configuration memory cells M5, M6. Area 424 includes programmable tristate buffers B7, B8 controlled by configuration memory cells M7, M8. (Each of the buffers and memory cells in FIG. 4 represents what would be many of these elements in an actual FPGA.)

In the embodiment of FIG. 4, the first set of interconnect resources optimized for high speed includes interconnect lines 403, 404, buffers B1, B2, and configuration memory cells M1, M2. The first set also includes buffers B3, B6 and configuration memory cells M3, M6, because these resources drive the interconnect lines optimized for high speed. The second set of interconnect resources optimized for low power includes interconnect lines 411, 412, buffers B7, B8, and configuration memory cells M7, M8. The second set also includes buffers B4, B5 and configuration memory cells M4, M5, because these resources drive the interconnect lines optimized for lower power.

In some embodiments, some or all of the transistors in the second set of resources have a higher threshold voltage than the transistors in the first set. As previously described, this higher threshold voltage reduces the power consumption of these transistors.

In some embodiments, the buffers in the first set are coupled to a different power source than the buffers in the second set. The buffers in the first set are coupled to a power source that supplies a higher voltage level, which increases the speed at which the buffers operate, but also increases the power consumption of the buffers.

In some embodiments, the buffers in the first set simply include transistors that are larger than corresponding transistors included in the buffers in the second set. Therefore, the buffers in the first set switch at higher speeds, but also consume more power than the buffers in the second set.

In some embodiments (not shown in FIG. 4), the fast interconnect resources include buffered interconnect lines, while the low-power interconnect resources include unbuffered interconnect lines. The unbuffered interconnect lines are slower, but have a significantly lower power consumption.

Preferably, FPGA implementation software is provided that determines which signals in the user circuit should be allocated to the high-speed interconnect resources, and which signals can utilize the low-power interconnect resources without adversely affecting the performance of the circuit. Presently available FPGA implementation software already includes timing-driven routing,tools that determine which signals are critical to the performance of the circuit and which are non-critical. This software can be modified to implement the methods of the present invention, which are now described.

Figure 5:
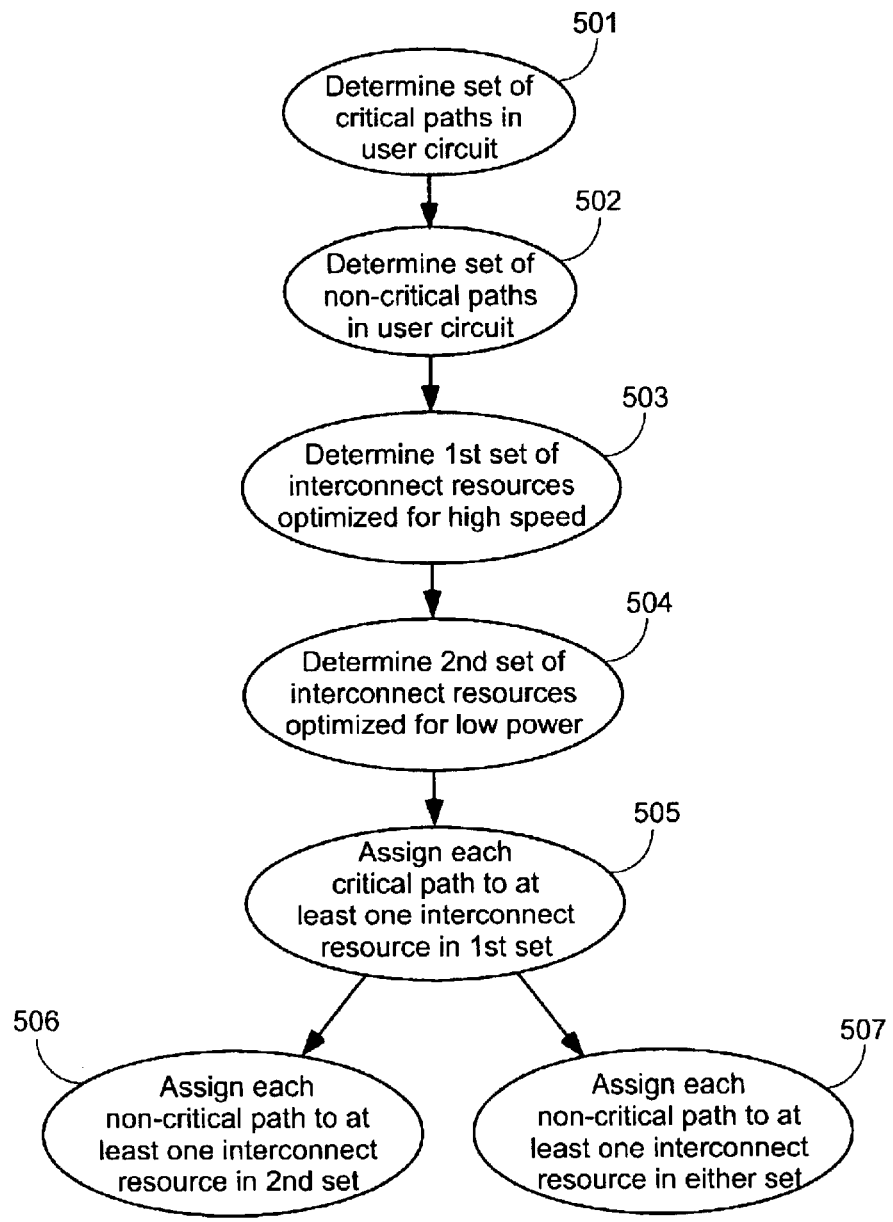
FIG. 5 is a flow diagram illustrating the steps of a method of routing a user circuit in an FPGA, according to an embodiment of the invention.

FIG. 5 shows the steps of a method of routing a user circuit in an FPGA, according to an embodiment of the invention. Steps 501–504 can be performed in any order, or concurrently. In step 501, a set of critical paths in the user circuit is determined. As in current timing-driven routing methods, the critical paths are preferably the paths with delays that determine the operating speed of the user circuit. In step 502, a set of non-critical paths in the user circuit is determined. The set of non-critical paths can be, for example, all paths that are not in the set of critical paths.

In step 503, a first set of interconnect resources optimized for high speed is determined. For example, the first set of interconnect resources can be determined by consulting a computer data file that identifies the resources in the first set. This file can be supplied by the FPGA provider, for example, and can be included with the FPGA implementation software package. In step 504, a second set of interconnect resources optimized for low power is determined. For example, the second set of interconnect resources can be determined by consulting the same computer data file that identifies the resources in the first set. In one embodiment, the second set of interconnect resources is determined by allotting to the second set all interconnect resources not included in the first set.

In step 505, each critical path determined in step 501 is assigned to interconnect resources from the first set of resources determined in step 503, i.e., to high-speed interconnect resources.

In some embodiments, in step 506 each non-critical path determined in step 502 is assigned to interconnect resources from the second set of resources determined in step 504. In these embodiments, steps 505 and 506 can be performed in any order, or concurrently.

In other embodiments, after assigning the critical paths (step 505), in step 507 each non-critical path determined in step 502 is assigned to interconnect resources from either of the first and second sets of resources determined in steps 503 and 504. This method can result in circuit implementations that consume more power than implementations resulting from step 506.

Some embodiments of the invention enable the use of routing software that is already commercially available. Existing timing-driven routing software typically uses cost functions to evaluate various routes, until a route is found that has the lowest "cost" and also meets the timing requirements specified for the design. According to some embodiments of the invention, a higher cost is assigned to the interconnect resources optimized for high speed, and a lower cost is assigned to the interconnect resources optimized for low power. Thus, the timing-driven routing software utilizes the standard cost function to assign signals to the two different types of routing resources in order to minimize power while meeting specified timing requirements for the circuit.

Figure 6:
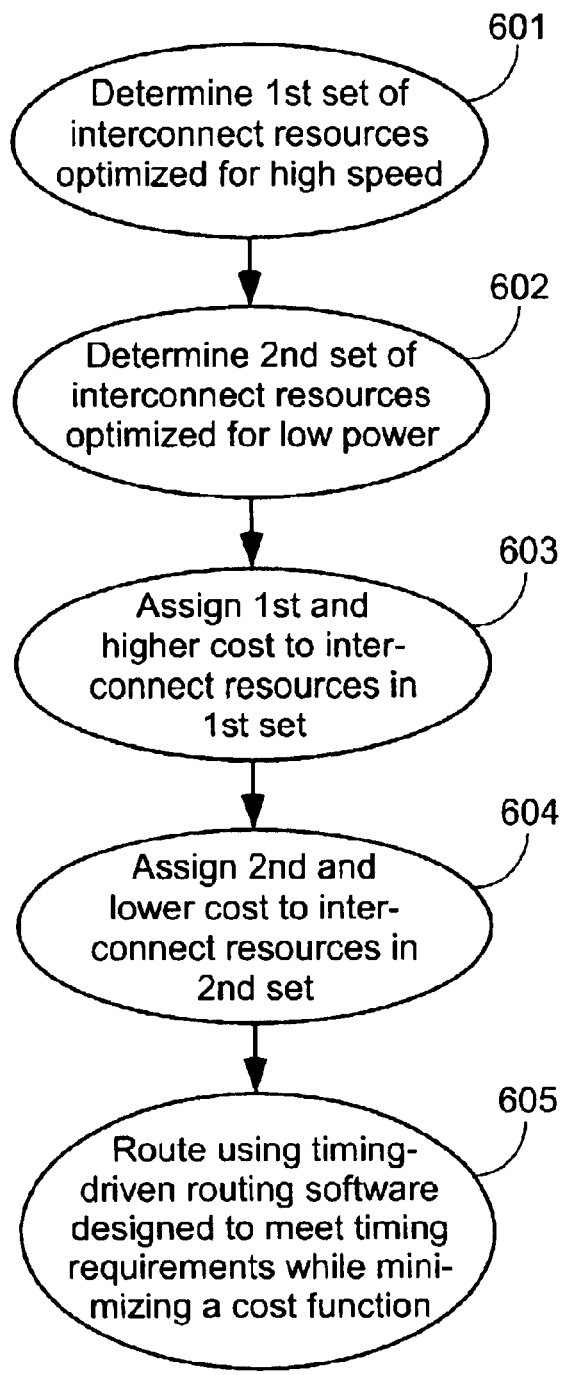
FIG. 6 shows the steps of a method of routing a user circuit in an FPGA, according to another aspect of the invention.

FIG. 6 illustrates the steps of one such method. In step 601, a first set of routing resources is determined that are optimized for high speed. For example, the first set of interconnect resources can be determined by consulting a computer data file that identifies the resources in the first set. This file can be supplied by the FPGA provider, for example, and can be included with the FPGA implementation software package. In step 602, a second set of interconnect resources optimized for low power is determined. For example, the second set of interconnect resources can be determined by consulting the same computer data file that identifies the resources in the first set. In one embodiment, the second set of interconnect resources is determined by allotting to the second set all interconnect resources not included in the first set. Steps 601 and 602 can be performed in any order, or concurrently.

In step 603, a first and higher cost is assigned to the resources in the first set. In step 604, a second and lower cost is assigned to the resources in the second set. Steps 603 and 604 can be performed in any order, or concurrently. In step 605, timing-driven routing software is used to route the design. The routing software is designed to meet specified timing requirements while minimizing a cost function utilizing the costs assigned to the interconnect resources in the first and second sets. Thus, the use of the cost function minimizes the amount of power consumed by the circuit.

The methods of the present invention can be performed in either hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the Internet.

Accordingly, the present invention is not limited to any particular platform.

Those having skill in the relevant arts of the invention will now perceive various modifications and additions that can be made as a result of the disclosure herein. For example, programmable interconnect structures, interconnect lines, programmable switches, logic blocks, configurable logic blocks, input/output blocks, FPGAs, transistors, buffers, tristate buffers, configuration memory cells, and other components other than those described herein can be used to implement the invention. Accordingly, all such modifications and additions are deemed to be within the scope of the invention, which is to be limited only by the appended claims and their equivalents.

What is claimed is:

1. A field programmable gate array (FPGA), comprising:
a plurality of configurable logic blocks (CLBs); and
a plurality of interconnect resources programmably interconnecting the CLBs,
wherein the interconnect resources comprise first and second sets of interconnect resources,
the interconnect resources in the first set are configured and arranged for high speed, and
the interconnect resources in the second set are configured and arranged for low power consumption, wherein:
the interconnect resources in the first set include a set of first transistors;
the interconnect resources in the second set include a set of second transistors; and
the first transistors have a lower effective threshold voltage than the second transistors.

2. The FPGA of claim 1, wherein the first transistors and the second transistors have different doping levels.

3. The FPGA of claim 1, wherein the first transistors and the second transistors are situated in wells biased to different voltage levels.

4. A field programmable gate array (FPGA), comprising:
a plurality of configurable logic blocks (CLBs); and
a plurality of interconnect resources programmably interconnecting the CLBs,
wherein the interconnect resources comprise first and second sets of interconnect resources,
the interconnect resources in the first set are configured and arranged for high speed, and
the interconnect resources in the second set are configured and arranged for low power consumption, wherein:
the interconnect resources in the first set include a set of first buffers coupled to a first power source;
the interconnect resources in the second set include a set of second buffers coupled to a second power source; and
the first power source supplied a higher voltage level than the second power source.

5. The FPGA of claim 1, wherein:
the interconnect resources in the first set include a set of first buffers;
the interconnect resources in the second set include a set of second buffers; and
the first buffers comprise larger transistors than do the the second buffers.

6. The FPGA of claim 1, wherein:
the interconnect resources in the first set include a plurality of buffered interconnect lines; and
the interconnect resources in the second set include a plurality of unbuffered interconnect lines.

* * * * *